(12) United States Patent
Lee et al.

(10) Patent No.: US 11,417,860 B2
(45) Date of Patent: Aug. 16, 2022

(54) ORGANIC LIGHT-EMITTING DISPLAY DEVICE

(71) Applicant: LG DISPLAY CO., LTD., Seoul (KR)

(72) Inventors: KyoungMook Lee, Gyeonggi-do (KR); NackBong Choi, Gyeonggi-do (KR); Dongyul Kim, Gyeonggi-do (KR); Myungwoo Han, Seoul (KR); YeonGyeong Bae, Gyeonggi-do (KR)

(73) Assignee: LG DISPLAY CO., LTD., Seoul (KR)

(*) Notice: Subject to any disclaimer, the term of this patent is extended or adjusted under 35 U.S.C. 154(b) by 301 days.

(21) Appl. No.: 16/670,829

(22) Filed: Oct. 31, 2019

(65) Prior Publication Data

US 2020/0144540 A1    May 7, 2020

(30) Foreign Application Priority Data

Nov. 5, 2018 (KR) .................... 10-2018-0134110

(51) Int. Cl.
*H01L 27/32* (2006.01)
*H01L 51/52* (2006.01)
*H01L 51/00* (2006.01)

(52) U.S. Cl.
CPC ...... *H01L 51/5253* (2013.01); *H01L 27/3246* (2013.01); *H01L 51/0097* (2013.01)

(58) Field of Classification Search
CPC ............ H01L 27/3246; H01L 27/3258; H01L 27/322; H01L 51/0097
See application file for complete search history.

(56) References Cited

U.S. PATENT DOCUMENTS

2017/0194399 A1* 7/2017 Cho .................... H01L 27/3248

FOREIGN PATENT DOCUMENTS

KR    10-2013-0077015 A    7/2013

* cited by examiner

*Primary Examiner* — Trang Q Tran
(74) *Attorney, Agent, or Firm* — Birch, Stewart, Kolasch & Birch, LLP

(57) ABSTRACT

An organic light-emitting display device includes an anti-peeling pattern. An organic light-emitting element including a pixel electrode, an organic light-emitting layer, and a common electrode is disposed on a substrate. A bank layer is disposed on the pixel electrode so as to expose at least a portion of the pixel electrode. The anti-peeling pattern having at least one delta-shaped space is disposed on the bank layer. The anti-peeling pattern, disposed on the bank layer, minimizes peeling of the encapsulation layer that can be caused by either compressive or tensile stress generated by bending in a flexing environment in which the organic light-emitting display device is used.

21 Claims, 9 Drawing Sheets

ORGANIC LIGHT-EMITTING DISPLAY DEVICE

CROSS REFERENCE TO RELATED APPLICATION

This application claims priority to Korean Patent Application No. 10-2018-0134110, fled on Nov. 5, 2018, which is hereby incorporated by reference for all purposes as if fully set forth herein.

BACKGROUND

Field

Embodiments of the present disclosure relate to an organic light-emitting display device and, more particularly, to an organic light-emitting display device having a structure able to minimize peeling of either an organic light-emitting layer or an encapsulation layer provided on a pixel electrode in a flexing environment, in which the organic light-emitting display device is folded and bent.

Description of Related Art

Organic light emitting display devices, also referred to as organic light-emitting diode (OLED) display devices, can be fabricated to have a thin and light profile, since OLEDs, i.e., self-light-emitting devices, are used therein, and thus, a separate light source is not required, unlike liquid crystal display (LCD) devices. In addition, OLED display devices are not only advantageous in terms of power consumption, due to low-voltage driving thereof, but also have excellent features in relation to color reproducibility, response speeds, and viewing angles, as well as contrast ratios (CRs). Accordingly, research into OLED display devices as the next-generation display devices has been undertaken.

In addition, the OLED display devices are advantageously applicable as curved or flexible display devices, since a separate light source is not required.

In an organic display device, pixel electrodes, an organic light-emitting layer, and a common electrode are provided on a substrate to be connected to a driver circuit of the substrate, so that the organic light-emitting layer is driven to emit light in response to a driving signal generated by the driver circuit.

In the organic light-emitting layer, the recombination of electrons and holes injected through the pixel electrodes and the common electrode generates excitons to emit light.

Since the organic light-emitting layer is especially sensitive to moisture and oxygen, an encapsulation layer comprised of one or more layers can be provided above the OLEDs in order to prevent the penetration of moisture or oxygen.

A thin-film encapsulation method of alternately stacking inorganic material layers and organic material layers is used to provide a seal to the OLEDs.

The inorganic material layer for thin-film encapsulation is mainly provided as an oxide layer, such as an aluminum oxide (AlOx) layer, since even a thin oxide layer can provide excellent barrier property. In particular, it is more advantageous to use an oxide layer as an inorganic material layer for thin-film encapsulation in order to provide a flexible OLED display device, since the thinner the thin-film encapsulation layer is, the higher the flexibility of the OLED display device can be.

However, the organic light-emitting layer tends to have a lower level of bonding ability, compared to the other components of the OLED display device. Consequently, peeling can occur along with the bending of the OLED display device.

In addition, the encapsulation layer can suffer from peeling, along with the bending of the OLED display device.

Related Art Document

Patent Document: Korean Patent Application Publication No. 10-2011-0145497, titled "Flexible OLED Display Device"

BRIEF SUMMARY

When a general organic light-emitting display panel, also referred to as a general organic light-emitting diode (OLED) display panel, is bent in a flexing environment as described above, peeling can occur in an organic light-emitting layer or a thin-film encapsulation layer of the general OLED display panel.

In a case in which the general OLED display panel is bent, one surface thereof is subjected to compressive stress, while the other surface thereof is subjected to tensile stress. A vulnerable portion of components of the general OLED display panel can be cracked or can be peeled from the substrate.

To address these limitations associated with the related art, the inventors have invented a novel structure of an OLED display panel, which is able to relieve stress in relation to compressive stress and tensile stress in an application environment in which the OLED display panel is flexed.

Various aspects of the present disclosure provide an improved organic light-emitting display device (also referred to as an OLED display device) having an improved structure that can minimize peeling of either an organic light-emitting layer or an encapsulation layer, which can be caused by repetitive bending stress in a flexing environment.

Also according to one or more embodiments of the present disclosure, there is provided an OLED display device in which peeling of either an organic light-emitting layer or an encapsulation layer, which may be caused by repetitive bending stress in a flexing environment, is minimized, so that the reliability of the OLED display device with respect to the flexing environment can be improved.

The objects of the present disclosure are not limited to the aforementioned description, and other objects not explicitly disclosed herein will be clearly understood by those having ordinary knowledge in the technical field to which the present disclosure pertains from the description provided hereinafter.

According to an aspect of the present disclosure, an OLED display panel having a structure able to minimize peeling of either an organic light-emitting layer or an encapsulation layer is provided. There, a pixel electrode is provided on a substrate, and a bank layer is provided on the pixel electrode to expose at least a portion of the pixel electrode, so that a pixel is defined by the exposed pixel electrode. The organic light-emitting and a common electrode are disposed on the exposed pixel electrode, and a first encapsulation layer and a second encapsulation layer are disposed on the common electrode. An anti-peeling pattern having a delta-shaped space is disposed on the bank layer. Accordingly, peeling of either the organic light-emitting layer or the encapsulation layer in the flexing environment can be minimized or prevented.

An OLED display device according to embodiments of the present disclosure can include an organic light-emitting element including a pixel electrode, an organic light-emitting layer, and a common electrode located on a substrate; and at least one encapsulation layer protecting the organic light-emitting element. The OLED display device can further include at least one anti-peeling pattern for the encapsulation layer, provided on a bank layer to expose the pixel electrode, with at least one side surface of the anti-peeling pattern having an inverted trapezoidal shape. As such, peeling of the encapsulation layer which may be caused by stress occurring in a flexing environment can be effectively minimized.

According to exemplary embodiments of the present disclosure, the anti-peeling pattern can minimize peeling of either the organic light-emitting layer or the encapsulation layer in a flexing environment in which the OLED display device is bent, so that the reliability of the OLED display device can be improved.

The effects of the present disclosure are not limited to the aforementioned description, and other effects not explicitly disclosed herein will be clearly understood by those having ordinary knowledge in the technical field to which the present disclosure pertains from the description provided hereinafter.

It should be understood that both the background section and the brief summary section are not intended to specify essential limitations of the Claims. Therefore, the scope of the Claims is by no means restricted by the description of the background section or the brief summary section.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION OF THE EMBODIMENTS

Figure 1A:
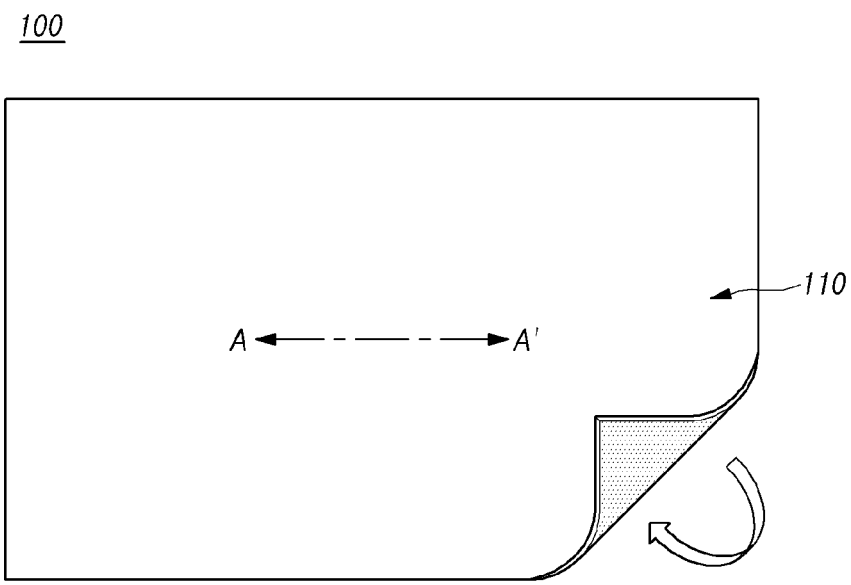
FIGS. 1A to 1C schematically illustrate a flexible environment according to embodiments of the present disclosure.

The advantages and features of the present disclosure and methods of the realization thereof will be apparent with reference to the accompanying drawings and detailed descriptions of the embodiments. The present disclosure should not be construed as being limited to the embodiments set forth herein and can be embodied in many different forms. Rather, these embodiments are provided so that the present disclosure will be thorough and complete, and will fully convey the scope of the present disclosure to those having ordinary knowledge in the technical field. The scope of the present disclosure shall be defined by the appended Claims.

The shapes, sizes, ratios, angles, numbers, and the like, inscribed in the drawings to illustrate exemplary embodiments are illustrative only, and the present disclosure is not limited to the embodiments illustrated in the drawings. Throughout this document, the same reference numerals and symbols will be used to designate the same or like components. In the following description of the present disclosure, detailed descriptions of known functions and components incorporated into the present disclosure will be omitted in the situation in which the subject matter of the present disclosure can be rendered unclear thereby. It will be understood that the terms "comprise," "include," "have," and any variations thereof used herein are intended to cover non-exclusive inclusions unless explicitly described to the contrary. Descriptions of components in the singular form used herein are intended to include descriptions of components in the plural form, unless explicitly described to the contrary.

In the analysis of a component, it shall be understood that an error range is included therein, even in the situation in which there is no explicit description thereof.

When spatially relative terms, such as "on," "above," "under," "below," and "on a side of," are used herein for descriptions of relationships between one element or component and another element or component, one or more intervening elements or components can be present between the one and other elements or components, unless a term, such as "directly," is used.

In addition, terms, such as "first" and "second" can be used herein to describe a variety of components. It should be understood, however, that these components are not limited by these terms. These terms are merely used to discriminate one element or component from other elements or components. Thus, a first component referred to as first hereinafter can be a second component within the spirit of the present disclosure.

The features of exemplary embodiments of the present disclosure can be partially or entirely coupled or combined with each other and can work in concert with each other or can operate in a variety of technical methods. In addition, respective exemplary embodiments can be carried out independently or can be associated with and carried out in concert with other embodiments.

Hereinafter, a variety of configurations of an organic light-emitting display device or organic light-emitting diode (OLED) display device having a structure able to minimize peeling of an organic light-emitting layer or an encapsulation layer according to embodiments will be described in detail with reference to the accompanying drawings. All components of the OLED display devices according to all embodiments of the present disclosure are operatively coupled and configured.

Figure 1B:
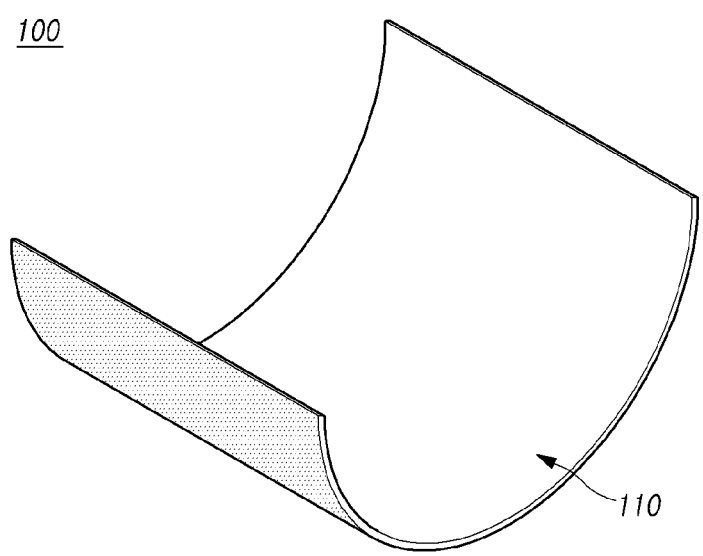
Figure 1C:
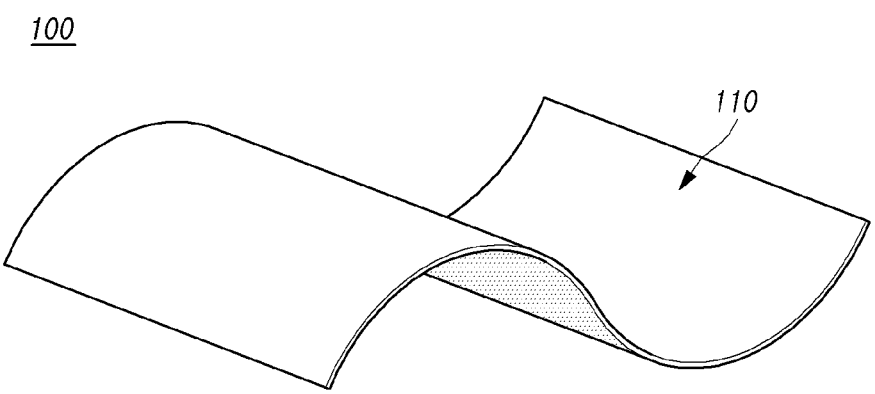

FIGS. 1A to 1C schematically illustrate a flexible environment according to embodiments of the present disclosure.

Describing with reference to FIGS. 1A to 1C, an OLED display device 100 has a substrate 110 serving as a base, and includes a variety of components for providing the display device on the substrate 110. The substrate 110 can have a plurality of pixel areas defined thereon, with thin-film transistors being located in the pixel areas, and can be made of a flexible plastic material.

The substrate 110 can comprise at least one of, but is not limited to, polyethersulfone, polyacrylate, polyetherimide, polyethylene naphthalate, polyethylene terephthalate, polyphenylene sulfide, polyallylate, polyimide, polycarbonate, or combinations thereof. The substrate 110 can be made of a variety of materials, from which a flexible substrate can be fabricated.

In the OLED display device 100 having the flexible substrate 110 as a base, a specific portion can be rolled, bent, or folded, as illustrated in FIG. 1A. As illustrated in FIG. 1B, the OLED display device 100 can be used as a rollable display device or an extremely-curved display device. In addition, the OLED display device 100 can be warped or bent in a variety of methods, as illustrated in FIG. 1C.

In an environment in which the flexible display device is bent or is extremely folded or unfolded, the adhesion between components disposed in the display device can be reduced, and thus, peeling or the like can occur. Hereinafter, a configuration for minimizing peeling in the flexing environment will be described in detail.

Figure 2:
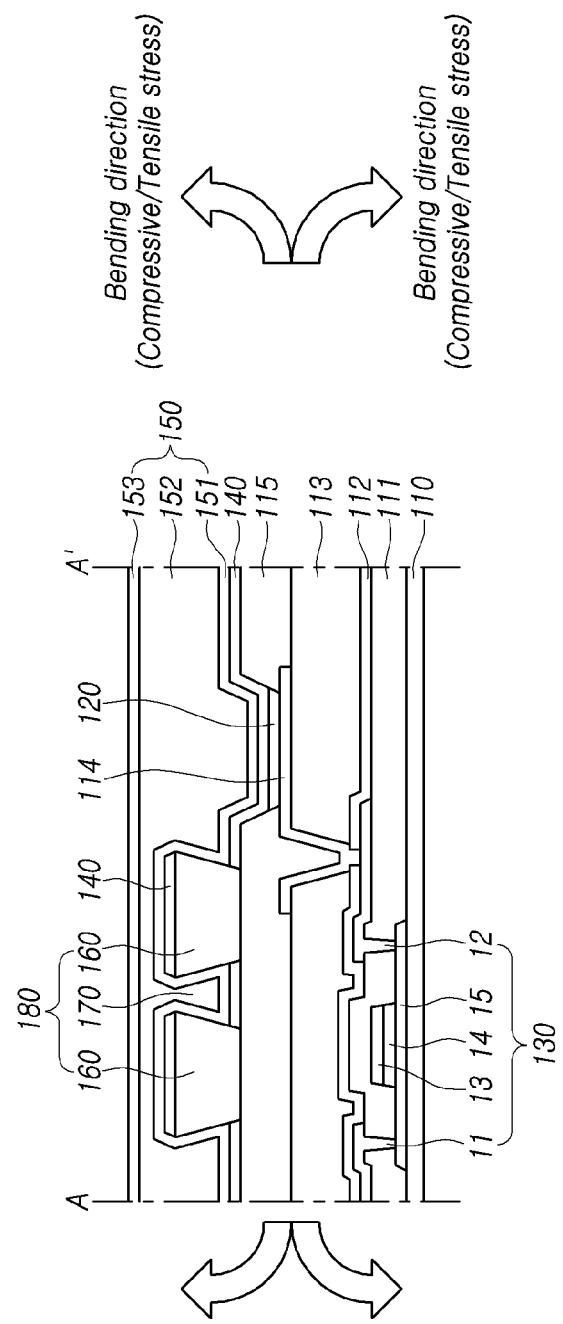
FIG. 2 is a schematic cross-sectional view illustrating the OELD display device according to embodiments of the present disclosure, taken along line A-A' in FIG. 1A.

FIG. 2 is a schematic cross-sectional view illustrating the OELD display device according to embodiments of the present disclosure, taken along line A-A' in FIG. 1A.

Referring to FIG. 2, the substrate 110 can be a flexible substrate. The following components for providing the OELD display device can be disposed on the substrate 110.

A semiconductor layer 15 is located on the substrate 110, and a gate insulating film 14 is located on the semiconductor layer 15. A gate electrode 13 is located on the gate insulating film 14 to correspond to the semiconductor layer 15. An insulating layer 111 is located on the gate electrode 13, and a source electrode 11 and a drain electrode 12 are provided on the insulating layer 111.

The source electrode 11 and the drain electrode 12 are connected to the semiconductor layer 15 through contact-holes extending through the insulating layer 111. Consequently, a thin-film transistor (TFT) 130 including the semiconductor layer 15, the gate electrode 13, the source electrode 11, and the drain electrode 12 is provided.

A passivation layer 112 and a planarization layer 113 are deposited on the source electrode 11 and the drain electrode 12, and a reflective electrode 114 is located on the planarization layer 113.

The planarization layer 113 can comprise a material having excellent heat resistance, such as acrylic resin, epoxy resin, phenolic resin, polyamide-based resin, polyimide-based resin, unsaturated polyester-based resin, polyphenylene-based resin, polyphenylene sulfide-based resin, or benzocyclobutene.

The passivation layer 112 can be provided as a single-layer structure or a multilayer structure, can be made of silicon oxide (SiO$_2$), silicon nitride (SiNx), or the like to prevent penetration of moisture or oxygen, or can comprise an organic material, such as polymer.

The reflective electrode 114 is connected to the drain electrode 12 of the TFT 130 through an electrical via extending through the planarization layer 113 and the passivation layer 112. Particularly, the reflective electrode 114 can be made of a high reflectivity material to reflect emission light.

For example, the reflective electrode 114 can comprise at least one of molybdenum (Mo), aluminum (Al), silver (Ag), chromium (Cr), gold (Au), titanium (Ti), nickel (Ni), neodymium (nd), or copper (Cu), or can be made of an alloy including at least one of the former materials.

A bank layer 115 is disposed on the planarization layer 113 so as to expose the reflective electrode 114. The bank layer 115 can be made of an organic insulating material having photosensitivity. For example, bank layer 115 can be made of at least one of polyimide, photoacrylic resin, benzocyclobutene (BCB), or combinations thereof. The bank layer 115 can also be made of a black color material, such as black resin.

In addition, an organic light-emitting layer 120 is disposed on the reflective electrode 114. The organic light-emitting layer 120 can be an organic light-emitting layer configured to emit red, green, or blue light, or can be an organic light-emitting layer configured to emit white light or ultraviolet (UV) radiation.

Referring to FIG. 2, the organic light-emitting layer 120 can be disposed in a specific area. However, the present disclosure is not limited thereto, and the organic light-emitting layer 120 can be disposed on the entire surface by a variety of processes.

A common electrode 140 is disposed on the organic light-emitting layer 120, and an encapsulation layer 150 is disposed on the common electrode 140. The common electrode 140 can be made of a transparent conductive material, such as indium tin oxide (ITO), and the encapsulation layer 150 can have a structure comprised of inorganic and organic material layers alternately stacked on each other.

The structure of the encapsulation layer 150, comprised of inorganic and organic material layers alternately stacked on each other, will be described in more detail with reference to FIG. 2. The encapsulation layer 150 can include a first encapsulation layer 151, a second encapsulation layer 152, a third encapsulation layer 153, and the like. For example, each of the first and second encapsulation layers 151 and 153 can be made of an inorganic material, while the second encapsulation layer 152 can be made of an organic material, such that the inorganic material and the organic material are alternately disposed.

In addition, an anti-peeling pattern 180 is provided on the bank layer 115. The anti-peeling pattern 180 includes at least one delta-shaped space 170. The delta-shaped space 170 is defined by a plurality of structures 160. The delta-shaped space 170 can have a shape similar to the Greek letter "Δ." The delta-shaped space 170 can be configured such that the bottom thereof is relatively wide and the top open area is relatively narrow.

The delta-shaped space 170 can be defined as a space between the plurality of structures 160. The plurality of structures 160 can have an inverted trapezoidal shape.

The plurality of structures 160 can be configured such that some side surfaces thereof, facing each other, have an inverted trapezoidal shape or entire side surfaces thereof have an inverted trapezoidal shape. In the plurality of structures 160, the side surfaces, facing each other, can have an inverted trapezoidal shape in order to reduce peeling.

The common electrode 140, located above the bank layer 115, can be disposed to cover the top portions of the structures 160. Here, portions of the common electrode 140, corresponding to the side surfaces of the inverted trapezoidal structures 160, are opened. Due to the step coverage of the conductive material of the common electrode 140, such as indium tin oxide (ITO) or indium zinc oxide (IZO), each of the slopes of the inverted trapezoidal structures 160 is not covered with the common electrode 140. Accordingly, the side surfaces of the inverted trapezoidal structures 160 are exposed.

Due to the exposed side surfaces of the structures 160, the encapsulation layer 150 is in direct contact with the structures 160. At least one layer among the plurality of layers of the encapsulation layer 150 can be in direct contact with the side surfaces of the inverted trapezoidal structures 160.

Since the anti-peeling pattern 180 on the bank layer 115 includes the delta-shaped space 170 and the inverted trapezoidal structures 160, peeling of the encapsulation layer 150 and the organic light-emitting layer 120, due to stress caused by external force, can be minimized.

Stress that would occur in a flexing environment can include compressive stress and tensile stress. The side surfaces of the inverted trapezoidal structures 160, more particularly, the side surfaces of the inverted trapezoidal structures 160 defining the delta-shaped space 170, can minimize stress-induced peeling, by direct contact with the first encapsulation layer 151.

Furthermore, a portion of the first encapsulation layer 151 is trapped in the delta-shaped space 170, so that the peeling of the encapsulation layer 150 can be further reduced. The delta-shaped space 170 can serve as a buffer to disperse external force, by which compressive stress is applied, while holding the encapsulation layer 150 from being dislodged by tensile stress.

The density of the anti-peeling pattern 180 including the delta-shaped space 170 defined by the plurality of structures 160 can be set to range from 7% to 15%, in consideration of the entire area of the display device. It can be appreciated that the anti-peeling performance is improved to be two to four times that of an existing anti-peeling pattern having a simple inverted trapezoidal shape.

The distance between the plurality of structures 160 of the anti-peeling pattern 180 can range from 4 µm to 6 µm, the width of the bottom of the delta-shaped space 170 can range from 4 µm to 6 µm, and the width of the top open area of the delta-shaped space 170 can range from 3 µm to 4 µm. Here, an acute angle defined between an outer portion of each of the structures 160 and the substrate 110 can range from 50° to 80°.

The distances between the structures 160 and pixels can range from 4 µm to 7 µm, since the viewing angle must be considered.

Portions of the common electrode 140 can be disposed on top of the structures 160. In a case in which deposition is performed to the entire surface of the organic light-emitting layer 120, portions of the organic light-emitting layer 120 can be disposed on top of the structures 160. However, as described above, the structures 160 have open areas in which neither the common electrode 140 nor the organic light-emitting layer 120 is disposed.

Figure 3A:
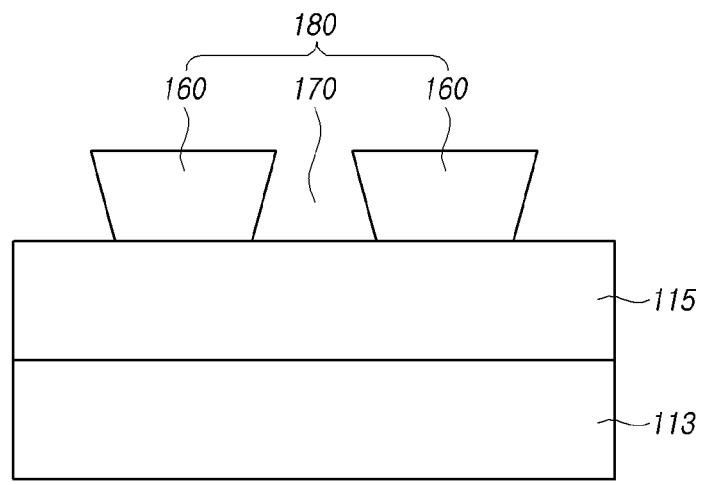
FIGS. 3A to 3C are schematic cross-sectional views illustrating a variety of configurations of the anti-peeling pattern according to embodiments of the present disclosure.
Figure 3B:
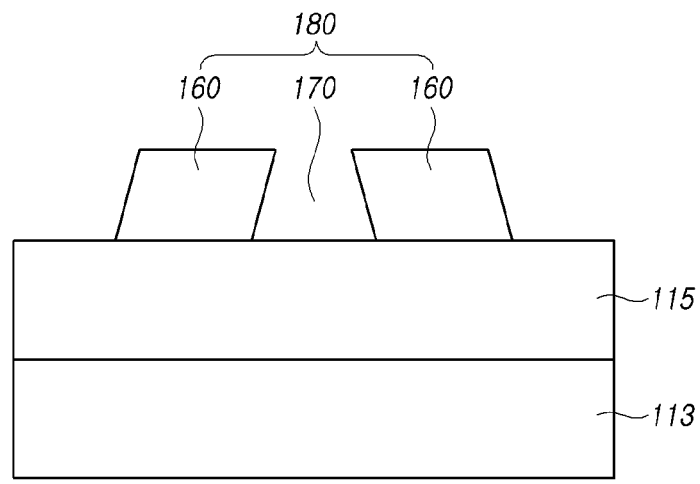
Figure 3C:
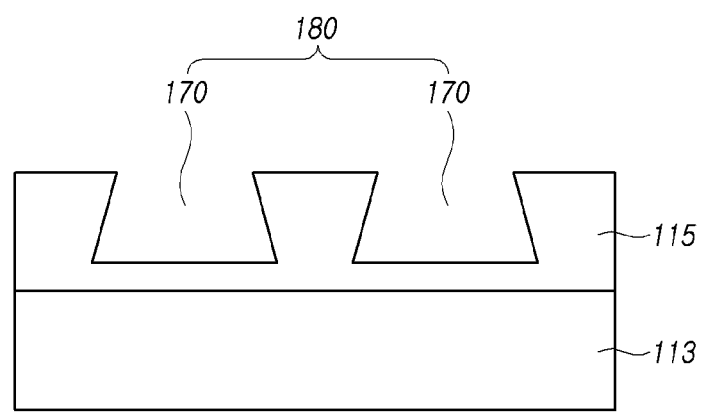

FIGS. 3A to 3C are schematic cross-sectional views illustrating a variety of configurations of the anti-peeling pattern according to embodiments of the present disclosure.

Referring to FIGS. 3A and 3B, the anti-peeling pattern 180 includes the plurality of structures 160 and the delta-shaped space 170 defined between the plurality of structures 160.

The inner side surfaces of the structures 160, facing each other, can be slopes of the inverted trapezoidal shapes, while the outer side surfaces of the structures 160, not facing each other, can be slopes of trapezoidal shapes, as illustrated in FIG. 3B.

In a case in which the outer side surfaces of the structures 160 of the anti-peeling pattern 180 are slopes of trapezoidal shapes, portions of the encapsulation layer 150, disposed on top of the structures 160 and within the delta-shaped space 170, can prevent the adhesion of the encapsulation layer 150 trapped within the delta-shaped space 170 from being reduced. Accordingly, the anti-peeling performance can be further improved.

FIG. 3C is a cross-sectional view illustrating another configuration of the anti-peeling pattern 180. Referring to FIG. 3C, the anti-peeling pattern 180 includes one or more delta-shaped spaces 170.

The anti-peeling pattern 180 can be fabricated by patterning the bank layer 115 located on the planarization layer 113. When separate structures are attached to the bank layer 115, the adhesion between the structures and the bank layer 115 can be reduced or the attached structures can collapse. In contrast, the anti-peeling pattern 180 having the plurality of delta-shaped spaces 170 can be fabricated by patterning the bank layer 115. For example, the anti-peeling pattern 180 can be fabricated by engraving the bank layer 115.

Figure 4A:
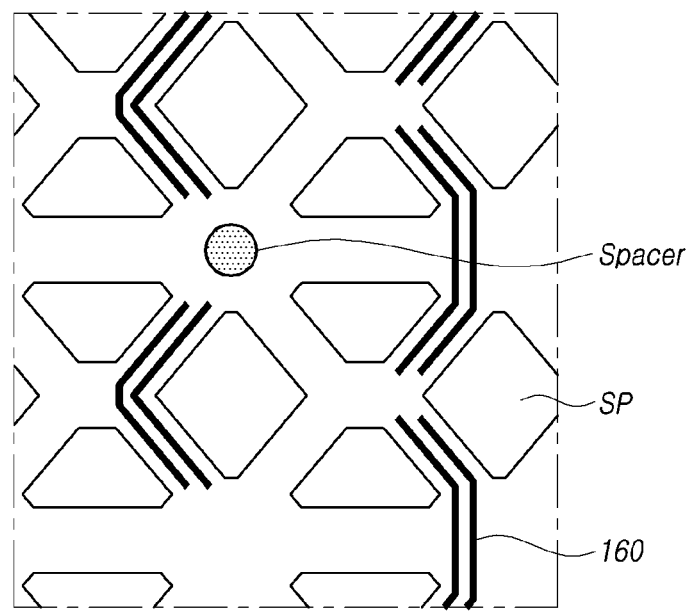
FIGS. 4A and 4B are schematic plan views illustrating a configuration of the anti-peeling pattern according to embodiments of the present disclosure.
Figure 4B:
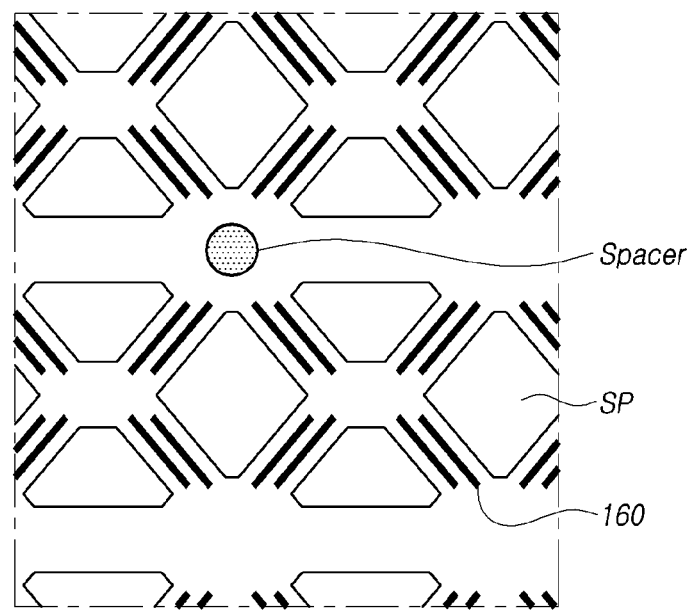

FIGS. 4A and 4B are schematic plan views illustrating a configuration of the anti-peeling pattern according to embodiments of the present disclosure.

Referring to FIGS. 4A and 4B, the plurality of structures 160 are disposed adjacent to pixels SP, in a direction parallel to a bending line, along which the OLED display device is to be bent. This can further increase the ability to resist bending-induced stress. In addition, since the plurality of structures 160 are disposed adjacent to pixels SP, the organic light-emitting layer in the pixels can be protected from stress, so that the peeling of the organic light-emitting layer can be minimized.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. An organic light-emitting display device comprising:
a pixel electrode of a sub-pixel disposed on a substrate;
a bank layer opened to expose the pixel electrode;
an organic light-emitting layer of the sub-pixel disposed on the pixel electrode;
a common electrode disposed on the organic light-emitting layer;
a first encapsulation layer and a second encapsulation layer disposed on the common electrode;
a thin-film transistor including a semiconductor layer, a gate electrode, a source electrode, and a drain electrode, the thin-film transistor being disposed adjacent to the sub-pixel; and
an anti-peeling pattern disposed on the bank layer to minimize peeling of the organic light-emitting layer or the first and second encapsulation layers, the anti-peeling pattern including a pair of inverted trapezoidal structures on the bank layer and at least one delta-shaped space disposed between the pair of inverted trapezoidal structures,
wherein the thin-film transistor is overlapped with the pair of inverted trapezoidal structures in a cross-sectional view.

2. The organic light-emitting display device according to claim 1, wherein the delta-shaped space is configured so that a bottom thereof is relatively wide and a top open area thereof is relatively narrow.

3. The organic light-emitting display device according to claim 1, wherein the anti-peeling pattern comprises engraved portions of the bank layer.

4. The organic light-emitting display device according to claim 1, wherein the anti-peeling pattern comprises more than two inverted trapezoidal structures on the bank layer.

5. The organic light-emitting display device according to claim 4, wherein a distance between the inverted trapezoidal structures ranges from approximately 3 µm to 5 µm.

6. The organic light-emitting display device according to claim 1, wherein the width of a bottom of the delta-shaped space ranges from approximately 4 µm to 6 µm, and the width of a top open area of the delta-shaped space ranges from approximately 3 µm to 4 µm.

7. The organic light-emitting display device according to claim 1, wherein each of the organic light-emitting layer and the common electrode has a discontinuous section within the delta-shaped space.

8. The organic light-emitting display device according to claim 7, wherein the first encapsulation layer comprises an inorganic material, and the second encapsulation layer comprises an organic material.

9. The organic light-emitting display device according to claim 8, wherein the anti-peeling pattern includes a structure in direct contact with the first encapsulation layer within the delta-shaped space.

10. An organic light-emitting display device comprising:
an organic light-emitting element including a pixel electrode of a sub-pixel, an organic light-emitting layer of the sub-pixel, and a common electrode located on a substrate;
at least one encapsulation layer protecting the organic light-emitting element;
a thin-film transistor including a semiconductor layer, a gate electrode, a source electrode, and a drain electrode, the thin-film transistor being disposed adjacent to the sub-pixel; and
at least one anti-peeling pattern for the encapsulation layer, provided on a bank layer to expose the pixel electrode,
wherein the at least one anti-peeling pattern comprises a pair of structures on the bank layer, and at least one delta-shaped space is disposed between the pair of inverted trapezoidal structures, and
wherein the thin-film transistor is overlapped with the pair of inverted trapezoidal structures in a cross-sectional view.

11. The organic light-emitting display device according to claim 10, wherein the anti-peeling pattern includes a plurality of structures, and
wherein surfaces of the structures, facing each other, have an inverted trapezoidal shape.

12. The organic light-emitting display device according to claim 11, wherein surfaces of the structures, not facing each other, have obtuse angles with respect to the bank layer.

13. The organic light-emitting display device according to claim 10, wherein the anti-peeling pattern comprises engraved portions of the bank layer.

14. The organic light-emitting display device according to claim 10, wherein the encapsulation layer includes at least one inorganic material layer,
the inorganic material layer being in direct contact with the bank layer within the inverted trapezoidal shape of the anti-peeling pattern.

15. The organic light-emitting display device according to claim 10, further comprising a pixel area defined by the exposed pixel electrode, wherein the anti-peeling pattern is disposed adjacent to the pixel area.

16. The organic light-emitting display device according to claim 10, wherein the anti-peeling pattern is arrayed in a direction parallel to a bending line defined in the organic light-emitting display device.

17. The organic light-emitting display device according to claim 10, wherein the pair of structures surround two sides of one sub-pixel.

18. The organic light-emitting display device according to claim 1, wherein the pair of inverted trapezoidal structures surround two sides of one sub-pixel.

19. The organic light-emitting display device according to claim 1, wherein at least one of the trapezoidal structures among the pair of inverted trapezoidal structures has a 90 degree bend in a plane view corresponding to a corner of one sub-pixel.

20. The organic light-emitting display device according to claim 1, wherein each of the pair of inverted trapezoidal structures has a bend of over 90 degrees in a plane view.

21. The organic light-emitting display device according to claim 1, wherein at least a portion of the first or second encapsulation layer is disposed in the at least one delta-shaped space.

* * * * *